United States Patent [19]

Law et al.

[11] 4,319,396

[45] Mar. 16, 1982

[54] METHOD FOR FABRICATING IGFET INTEGRATED CIRCUITS

[75] Inventors: Hung-Fai S. Law, Summit; Alexander D. Lopez, Warren, both of, NJ

[73] Assignee: Bell Telephone Laboratories, Incorporated, Murray Hill, N.J.

[21] Appl. No.: 108,289

[22] Filed: Dec. 28, 1979

[51] Int. Cl.³ .................... H01L 21/74; H01L 21/88
[52] U.S. Cl. .................................. 29/571; 29/577 R; 29/577 C
[58] Field of Search ................ 29/571, 577 R, 576 R, 29/577 C; 365/72; 357/45

[56] References Cited

U.S. PATENT DOCUMENTS

| | | | |
|---|---|---|---|
| 3,747,200 | 7/1973 | Rutledge | 29/571 |
| 3,753,005 | 8/1973 | Bertram et al. | 357/45 |
| 3,865,650 | 2/1975 | Arita | 29/577 |
| 4,125,854 | 11/1978 | McKenny | 357/45 |
| 4,218,693 | 8/1980 | Gee et al. | 357/45 |

*Primary Examiner*—Donald L. Walton
*Attorney, Agent, or Firm*—Arthur J. Torsiglieri

[57] ABSTRACT

A rapid and systematic method for performing chip layout of a random-logic IGFET circuit includes steps for arranging the device features and interconnection features corresponding to the circuit in respective positions in an array of intersecting rows and columns. The method provides layouts of device and interconnection features having a high packing density and a high degree of order and regularity to facilitate checking for layout errors.

4 Claims, 20 Drawing Figures

METHOD FOR FABRICATING IGFET INTEGRATED CIRCUITS

BACKGROUND OF THE INVENTION

This invention relates to a method for fabricating insulated gate field effect transistor (IGFET) integrated circuits, and more particularly to a fabrication method which arranges device features on a chip for a random-logic circuit in a manner compatible with convenient layout of the chip.

IGFET integrated circuits are well known in the art. Such circuits are normally fabricated with p-channel, n-channel or complementary channel versions of the metal-oxide-semiconductor technology; such version being commonly referred to as PMOS, NMOS, and CMOS, respectively. Each of these IGFET technologies has the capability for fabricating large scale integration (LSI) circuits having as many as tens of thousands of transistors on a single substrate chip of silicon or sapphire.

A significant part of the cost of manufacturing an LSI circuit is in the layout of the chip. In the layout process device features which are to be formed on a chip through a series of processing steps are arranged to correspond to a desired circuit configuration. Such a process can be difficult and time consuming particularly in the case of the larger LSI circuits where as many as hundreds of thousands of device features forming transistors and circuit interconnections must be arranged on a chip in a densely packed manner.

Achieving a high packing density of device features is a major objective in the chip fabrication process. Inasmuch as the manufacturing yield of a chip decreases rapidly with increasing chip area it is important from the standpoint of lower manufacturing cost manufacture to keep the chip area for a given circuit as small as practicable. However, in many cases achieving a high packing density increases the time required for chip layout, and, therefore, the chip design cost.

For circuits which have a high degree of repetitiveness, such as a random access memory (RAM), a read only memory (ROM), a programmable logic array (PLA) and the like chip layout is greatly simplified by the fact that the chip features for such circuits occur repetitively in a regular ordered array. For example in the case of a RAM having several thousand storage cells the layout of a cell is performed only once and the same cell configuration is repeated at each storage cell location in an ordered and regular array.

However, for circuits having little or no repetitiveness, often referred to as random-logic circuits, the chip layout process using prior art techniques can be difficult and time consuming. Some LSI circuits, such as microprocessors have on the same chip portions which are repetitive (e.g., a PLA) and portions which are random-logic (e.g., an arithmetic logic unit).

The most commonly used method for chip layout of a random-logic circuit is for a chip designer to place device feature individually or in groups according to his judgement to achieve the desired circuit and a high packing density. Because this method, which is sometimes referred to as the "handpacking" method, involves no systematic steps or rules, the packing density which is achieved for a given circuit depends largely on the skill of the chip designer and the amount of time spent in making the layout. Therefore, a problem with the fabrication of random-logic LSI circuits is the difficulty and expense of chip layout using the "handpacking" technique.

Frequently, to expedite the chip layout process for a large LSI circuit the layout task is divided among several chip designers who each perform layout on a different portion of the chip. Where the "handpacking" method is used it is difficult to predetermine the positions of signal lines and of the areas and shapes of the portions by the different chip designers. Therefore, problems often arise when the different portions of the chip are finally combined and the time savings derived from dividing the layout task is offset by increased chip area usage caused by complexities of interconnection between the different portions of the chip.

Another problem related to the layout of an LSI chip is the checking for errors once a layout is completed. Not only must the device features be properly placed to achieve a functional circuit but the sizes of device features and the spacings between device features must be within permissable tolerances as required by the particular technology being used to fabricate the circuit. The usual method for error checking is by visual inspection of the completed layout. The method is extremely tedious and unreliable for a large layout made by the "handpacking" method. Error checking by visual inspection is much less tedious and more reliable for circuits having order and regularity.

A known prior art technique for reducing the cost of chip layout and error checking for random-logic LSI circuits is the standard cell method for chip layout. In this method the layouts for all the basic logic elements (i.e., gates, flip-flops, etc.) called standard cells which have been previously made, are available in a "library" of standard cells. In the layout process for a circuit those standard cells which are required by the circuit are placed in spaced apart rows deployed over the chip area. The spacings between the rows serve as "wiring channels" for conductor paths interconnecting the various standard cells. Placement of the cells in the rows are selected to minimize the areas of the "wiring channels". Error checking in chip layouts by the standard cell method is simplified because the standard cells themselves are generally proven patterns which need no further checking and the interconnections of the circuit which are confined to "wiring channels" are easily traced. Although the standard cell method provides large time savings in chip layout and error checking, it is deficient from the standpoint of chip area usage. Inasmuch as the interconnections of a standard cell chip layout are confined to "wiring channels" and restricted from the standard cell regions chip area usage is far from being optimal. For a given random-logic circuit, a standard cell chip layout may require as much as ten to twenty percent more chip area than "handpacked" layout of the same circuit. Thus, there is clearly a need for a rapid and systematic method for chip layout of a random-logic circuit which provides efficient usage of chip area and which facilitates checking for layout errors. Finally, it is important that the chip layout be compatible with facile fabrication of the chip.

SUMMARY OF THE INVENTION

A solution to the foregoing and other problems which overcomes the deficiencies of the prior art is provided by the present invention in a method for arranging device features corresponding to an IGFET random-logic circuit in a special array of intersecting rows and columns. This approach permits both convenient layout and easy fabrication of the chip. According to one embodiment of the invention the gate insulator region of each transistor in the circuit is positioned in respective locations in the array overlying a semiconductive region. Those gate insulator regions corresponding to transistors having gate electrodes connected to a common gate node are arranged in the same row. The gate insulator regions situated in adjacent columns are spaced apart but the gate insulator regions situated in adjacent rows in the same column are adjoined to form merged gate insulator regions. A gate conductor path is positioned to lie along each row overlying all gate insulator regions in the row and serving as a commonly connected gate electrode for each transistor in the row. Source/drain regions are formed in the semiconductive regions underlying portions of the gate insulator regions not directly underneath a gate conductor path. Remaining circuit connections are made by forming electrical contacts to selected source/drain regions and forming second conductor paths for interconnecting the contacts and extending generally orthogonally to the gate conductor paths.

The present invention by restricting the device features of a random-logic circuit to respective positions in an array provides a systematic and rapid method for chip layout and results in a device feature pattern having a high degree of order and regularity thereby facilitating the checking for layout errors.

DETAILED DESCRIPTION

Referring now to FIGS. 1 through 5 there are shown perspective views of a portion of an integrated circuit chip depicting the processing steps for forming the device features of a metal-oxide-semiconductor (MOS) transistor using the well known "self-aligned" silicon gate method. Only those processing steps which are essential to the understanding of the present invention are shown in FIGS. 1 through 5. The actual patterning of the device features on the chip is by the well-known techniques of photo-lithography or electron beam lithography currently in use throughout the integrated circuit industry.

Figure 1:
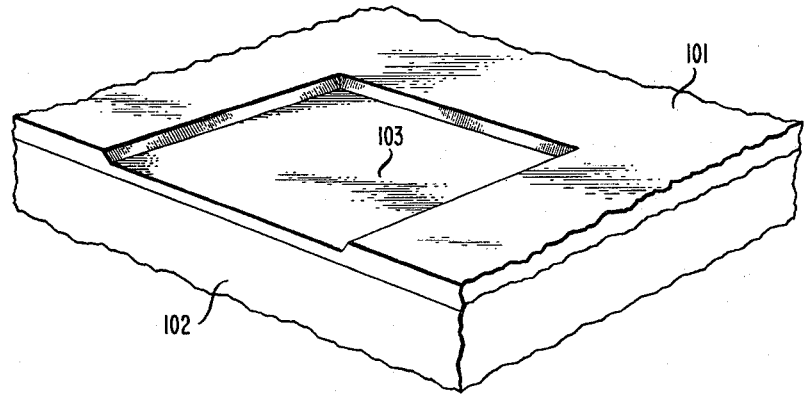
FIGS. 1 through 5 are perspective views showing in sequence the steps for forming device feature associated with an MOS transistor and connections to the transistor.
Figure 2:
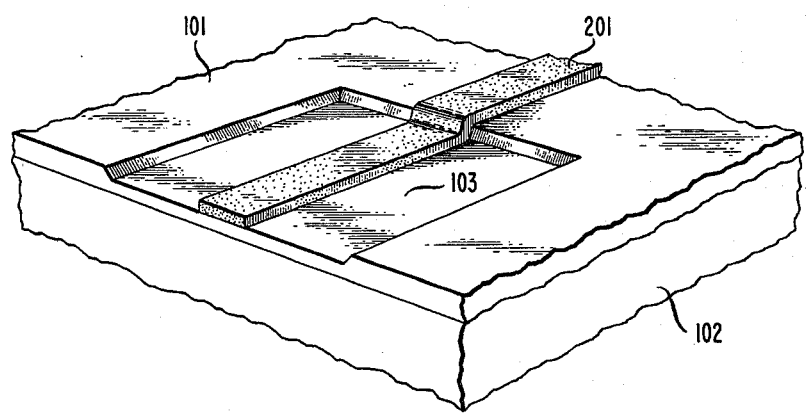
Figure 3:
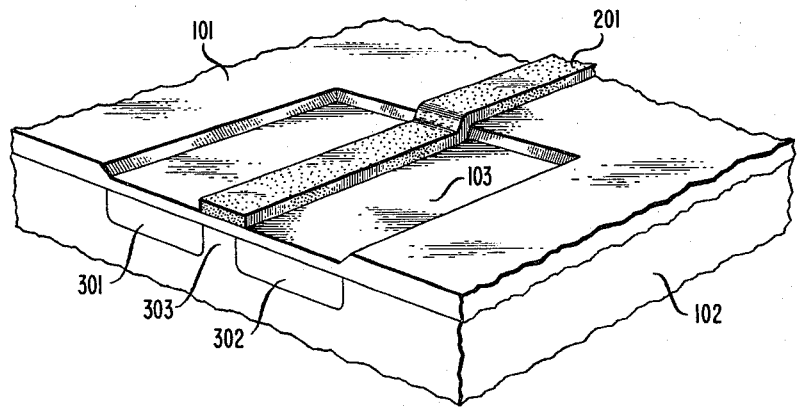
Figure 4:
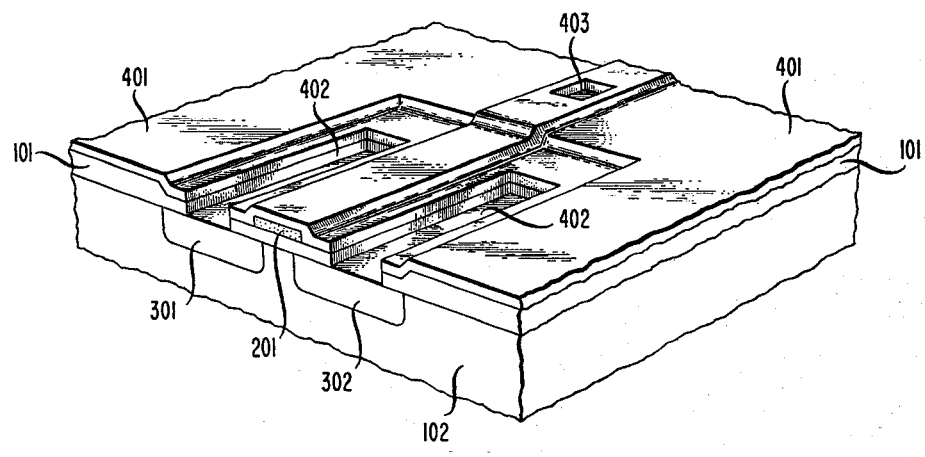
Figure 5:
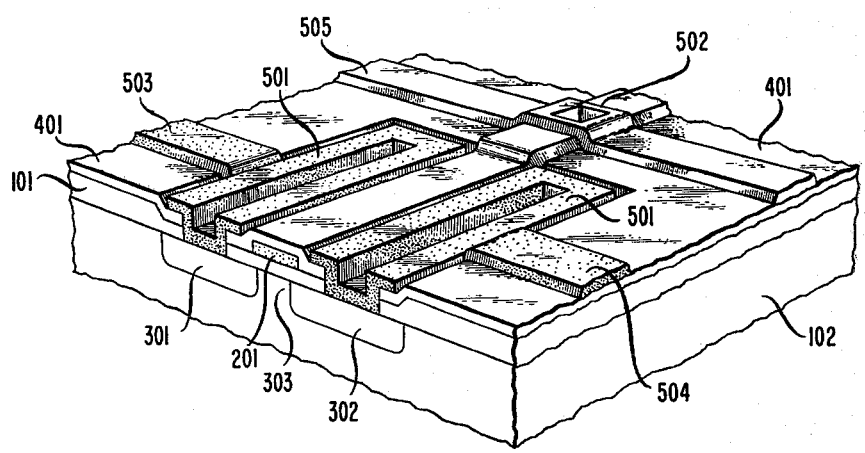

The formation of the gate insulator region of the transistor is shown in FIG. 1. First a field oxide layer 101 is thermally grown over a lightly doped silicon bulk region 102. Depending on whether the transistor being formed is to have a p-type or n-type channel, the bulk region is either n-type or p-type, respectively. A portion of the field oxide region is etched away and a thin oxide region 103 which serves as the gate insulator region for the transistor is thermally grown. FIG. 2 illustrates the formation of the gate electrode of the transistor. A polysilicon path 201 running over both field oxide and thin oxide regions is formed. The portion of the polysilicon or gate conductor path overlying the thin oxide region serves as the gate electrode of the transistor while the remainder serves as a conductor connected to the gate electrode. Thus the polysilicon layer in addition to providing gate electrodes for the transistors also provides a first conductor level for forming circuit interconnections. The formation of the source/drain regions of the transistor is illustrated in FIG. 3. Regions 301 and 302 which are relatively highly doped and of the opposite conductivity type to the bulk region are formed by diffusion or ion-implantation in portions of the bulk region underlying areas of the thin oxide region not covered by the polysilicon path 201. The source/drain regions do not extend into the channel region 303 which is masked by the polysilicon path. Each of the regions 301 and 302 may interchangeably serve as either the source region or the drain region of the transistor. FIG. 4 illustrates the formation of contact windows to the source/drain regions and to the polysilicon path. After an intermediate oxide layer 401 is thermally grown or deposited, source/drain contact windows 402 and polysilicon contact window 403 are etched open through the oxide layers. Formation of source/drain contacts 501, and a polysilicon contact 502 by depositing a metal layer over respective contact windows is depicted in FIG. 5. The metal layer also provides a second conductor level for making circuit interconnections via paths such as those designated by reference numerals 503, 504, and 505. In performing the layout of a circuit, device feature and interconnection paths such as those illustrated in FIGS. 1 through 5 are arranged on a chip to achieve the desired circuit.

Figure 6:
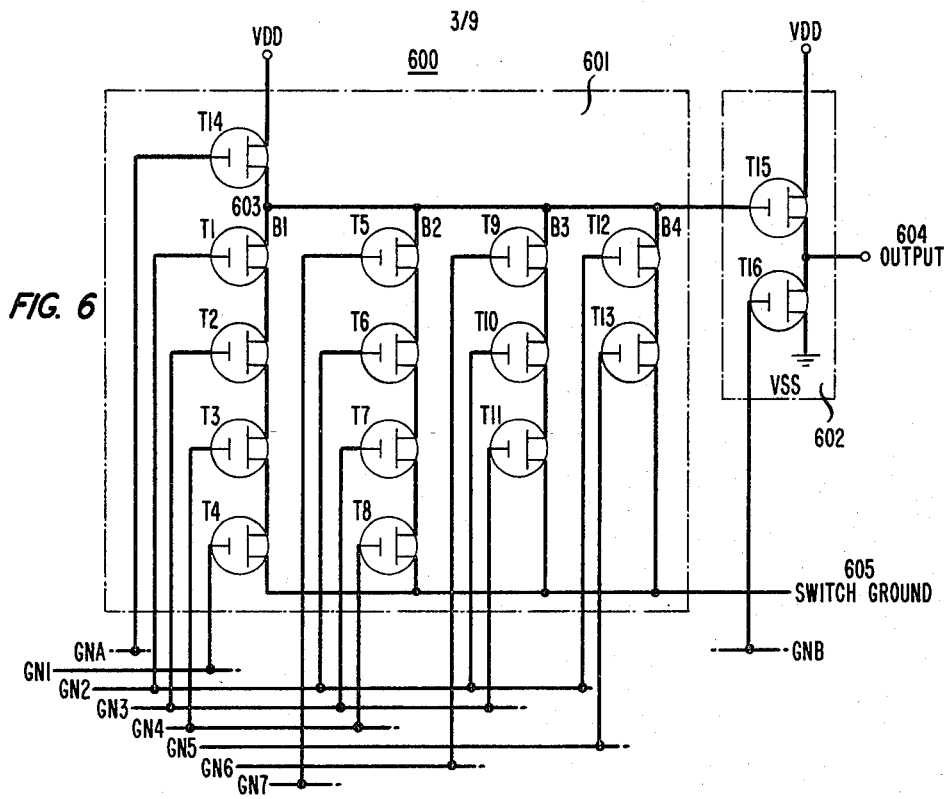
FIG. 6 is a schematic diagram of an IGFET circuit having serially connected combinations of branch transistors.

Referring now to FIG. 6, there is shown a schematic diagram of an IGFET circuit 600 of a type which is used in LSI circuits. It is not uncommon for an LSI circuit to have several hundred such circuits on one chip. The circuit shown includes a logic portion 601 having a load section consisting of a single transistor T14 connected from a VDD power supply node to a single node 603 and a driver section consisting of four branches B1 through B4 connected from the signal node 603 to a switch ground node 605 (also referred to as the common node). A branch of a circuit is commonly defined as any combination of one or more circuit elements representing an independent current path between two circuit nodes. Current paths are independent when they are not joined. Thus, since each of the series connected combinations of transistors designated in FIG. 6, as B1 through B4, represents an independent current path between the signal node 603 and the common node, each can be referred to as a branch. However, for purposes of describing the present invention the definition of a branch also includes a combination of two or more individual transistors connected in parallel between the signal node and the common node.

Each branch of the driver section consists of a different series connected combination of branch transistors T1 through T13. The gate electrodes of each branch transistor is connected to one of the input signal lines GN1 through GN7. The signal lines of the circuit are hereafter referred to as gate nodes. The gate electrodes of branch transistors within a given branch are each connected to a different gate node. The gate electrode of the load transistor T14 is connected to gate node GNA.

The circuit also includes an output portion 602 which consists of a single load transistor T15 connected from the VDD node to an output node 604 and a single driver transistor T16 connected from the output node to a VSS power supply node. The gate electrode of T15 is connected to the signal node 603 of the logic portion and the gate electrode of T16 is connected to gate node GNB.

Figure 7:
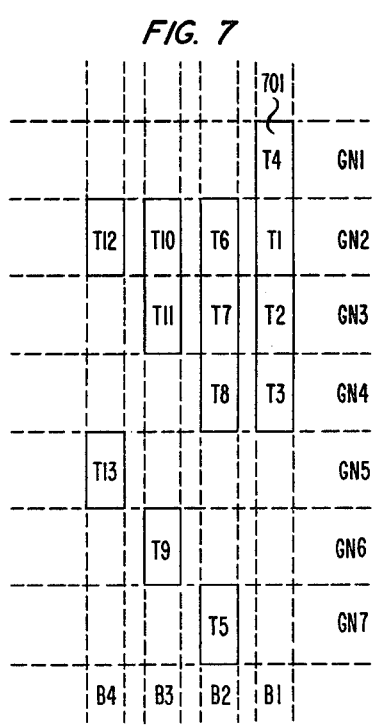
FIGS. 7 through 10 are plan views showing in sequence the steps for deriving an arrangement of device features corresponding to the circuit of FIG. 6.
Figure 8:
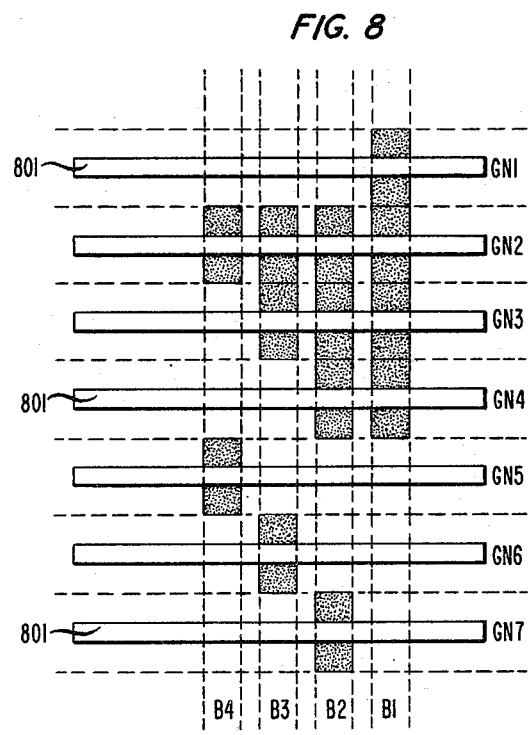
Figure 10:
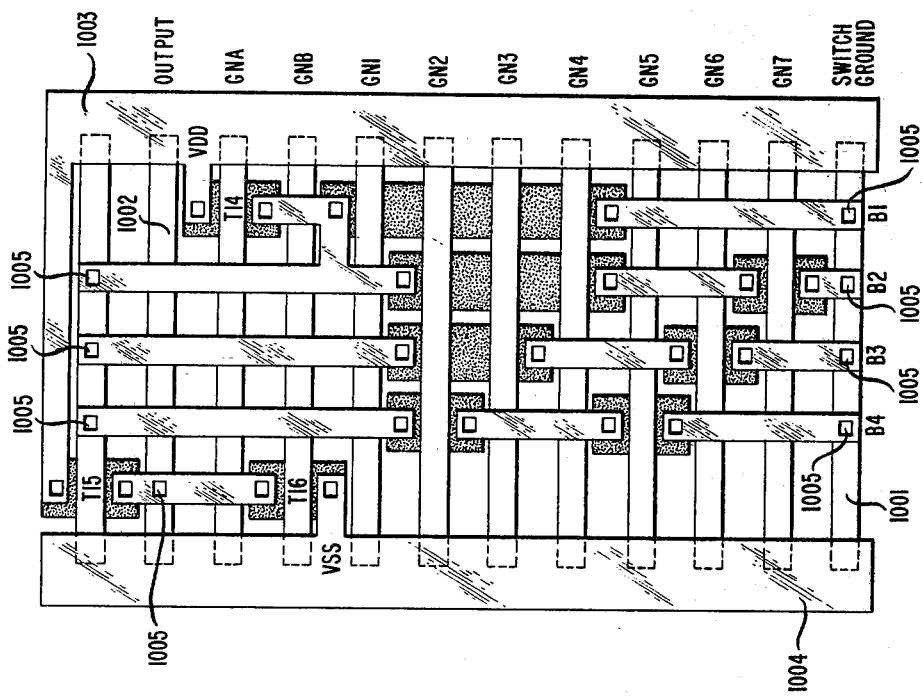
Figure 9:
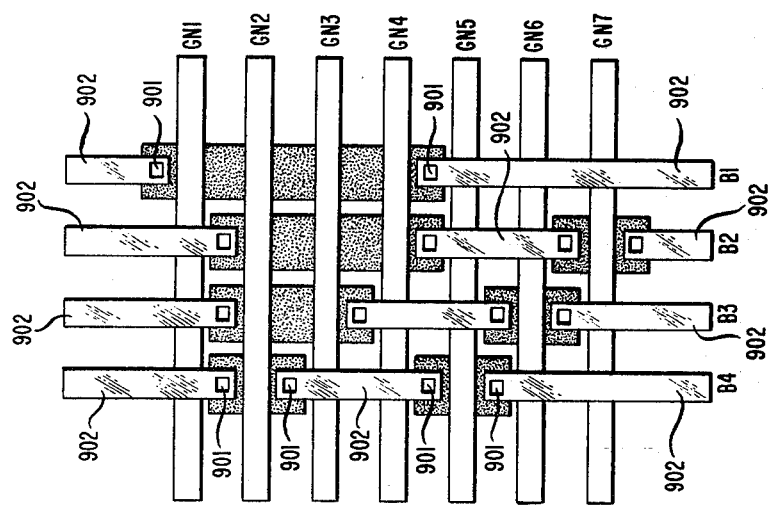

Referring now to FIGS. 7 through 10, there are shown surface views of a chip illustrating the sequence of steps used to layout the circuit of FIG. 6 in accordance with the present invention. The processing steps used to form the device feature are the same as those described in connection with FIGS. 1 through 5. It is convenient from the standpoint of explaining the present method to treat the layout of the logic and output portions and the load and driver sections of each portion separately. Therefore, FIGS. 7 through 9 illustrate only the layout of the driver section of the logic portion, while FIG. 10 illustrates the layout of the entire circuit.

FIG. 7 depicts the formation of the thirteen thin oxide regions each one corresponding to a different branch transistor T1 through T3 and designated by the corresponding transistor designation. Each thin oxide region is formed over a silicon bulk region as represented by the perspective view of FIG. 1. In the case where the circuit is fabricated with silicon-on-sapphire technology, each thin oxide region would overlie a separate silicon bulk region. The thin oxide regions are disposed in an array of intersecting rows and columns. Each column corresponds to one of the branches B1 through B4 in the circuit. The number of columns that are used for a particular branch is equal to the largest number of branch transistors in the particular branch having their gate electrodes connected to the same gate node. Since in the circuit of FIG. 6 the gate electrodes of the branch transistors belonging to any given branch are each connected to a different gate node, this number is one and each column in the array corresponds to a single different branch. Thus, there are four columns in the array and the thin oxide regions corresponding to all branch transistors belonging to a given branch are situated in the column corresponding to the given branch. For example, the thin oxide regions corresponding to branch transistors T1 through T4 belonging to branch B1 are all situated in the column designated by B1.

Each row in the array corresponds to a different one of the gate nodes GN1 through GN7 which are connected to the branch transistors and contains the thin oxide regions associated with all branch transistors having their gate electrodes connected to the corresponding gate node. For example, the thin oxide regions corresponding to branch transistors T1, T6, T10, and T12 which have their gate electrodes connected to gate node GN2 are all situated in the row designated by GN2.

The thin oxide regions in adjacent columns in the array are spaced apart with the spacing being determined by the design rules of the particular technology being used to fabricate the circuit. However, the thin oxide regions in adjacent rows of the same column are adjoined to form merged thin oxide regions. For example, the thin oxide regions corresponding to transistors T4, T1, T2, and T3 in column B1 are adjoined to form a merged region 701 while the thin oxide region corresponding to transistor T5 in column B2 remains nonadjoined.

The formation of the polysilicon paths and the source/drain regions is illustrated in FIG. 8. A polysilicon path 801 is positioned along each of the rows in the array, forming the gate electrodes of all transistors in the row and serving as the gate node corresponding to the row. After the formation of the polysilicon paths, source/drain regions, represented by shaded areas, are formed in the silicon bulk regions underlying portions of the thin-oxide regions which are not covered by a polysilicon path. A perspective view showing a representative polysilicon path, a representative thin oxide region, and representative source/drain regions is provided in FIG. 3.

FIG. 9 shows the complete layout for the driver section after the opening of contact windows 901 to selected source/drain regions, the formation of metal contacts over the contact windows, and the formation of metal paths 902 to complete the required circuit connections. Perspective views of representative contact windows, source/drain metal contacts, and metal paths are shown in FIG. 5. The metal paths are insulated from the polysilicon paths by the intermediate oxide layer 401 except at a metal to polysilicon contact 502.

The complete layout of the circuit of FIG. 6 including the load section of the logic portion and the load and driver sections of the output portion is shown in FIG. 10. The layout of the other portions are performed separately according to the above-described steps and interconnected with the layout shown in FIG. 9. Since each of these other sections consist of only a single transistor details of their layout and interconnection are readily apparent without further illustrations. Polysilicon paths 1001 and 1002 are added to serve as the switch ground node and the output node, respectively. These additional polysilicon paths lie along spare rows having no gate insulator region. The layout may also include additional polysilicon paths which serve as feed-through conductors for signals between other circuits on the same chip. Wide metal paths 1003 and 1004 are provided to serve as the VDD and VSS power supply nodes, respectively. As noted above, all metal paths are insulated from the polysilicon paths except at metal to polysilicon contacts 1005 where provided. Also, as can be seen from FIG. 10, the metal paths except for a few sections extend generally orthogonally to the polysilicon paths.

Figure 11:
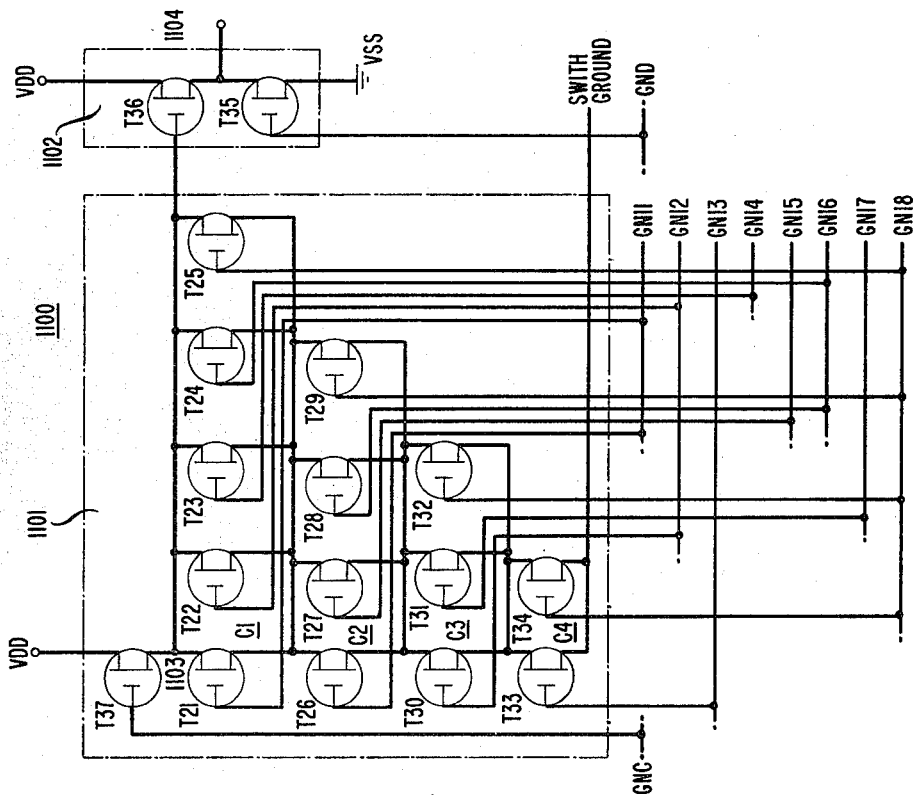
FIG. 11 is a schematic diagram of an IGFET circuit having parallel connected combinations of branch transistors.

Referring now to FIG. 11, there is shown a schematic diagram of a circuit in which the driver section of the logic portion 1101 has four parallel combinations of branch transistors T21 through T34, the combinations which are designated as C1 through C4 being connected in series from a signal node 1103 to a switch ground node. Since all current paths between the signal node 1103 and the switch ground node are joined, the entire driver section must be considered as one branch. The gate electrode of each branch transistor is connected to one of the gate nodes GN11 through GN18. The load section of the driver portion consists of a single transistor T37 having its gate electrode connected to gate node GNC. The output portion 1102 of the circuit has a single load transistor T36 having its gate electrode connected to the signal node 1103 of the logic portion and a single driver transistor T35 having its gate electrode connected to gate node GND.

Figure 12:
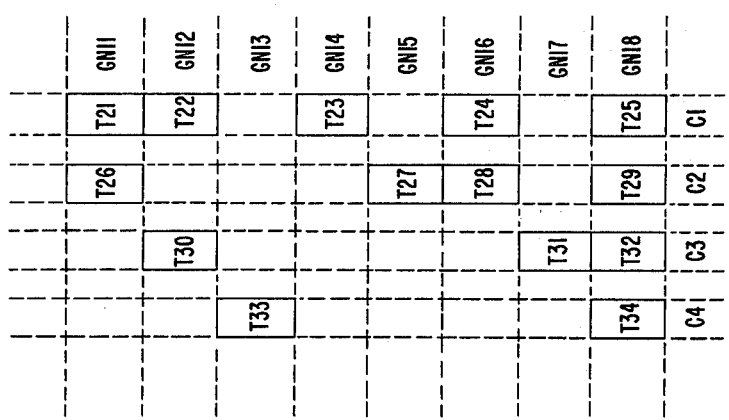
FIGS. 12 through 15 are plan views showing in sequence the steps for deriving an arrangement of device features corresponding to the circuit of FIG. 11.
Figure 14:
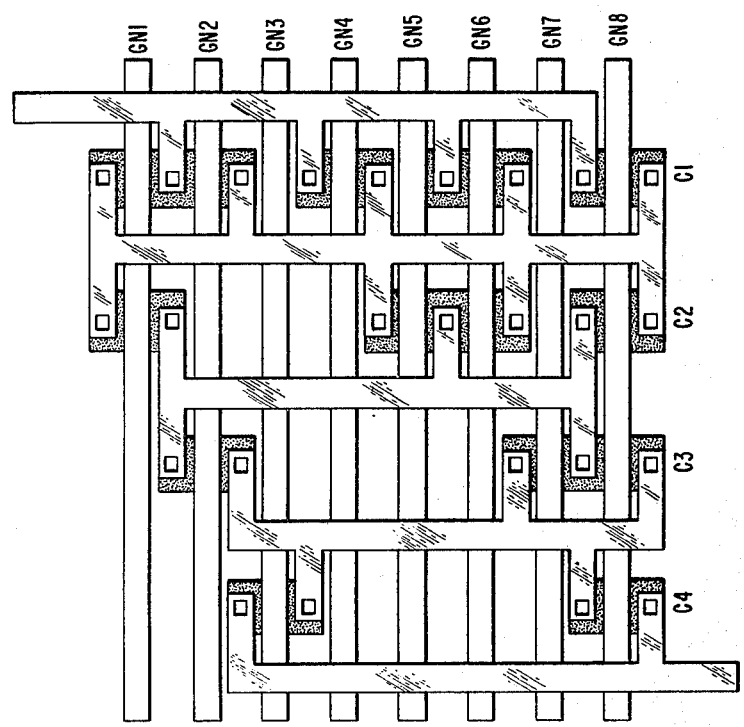
Figure 13:
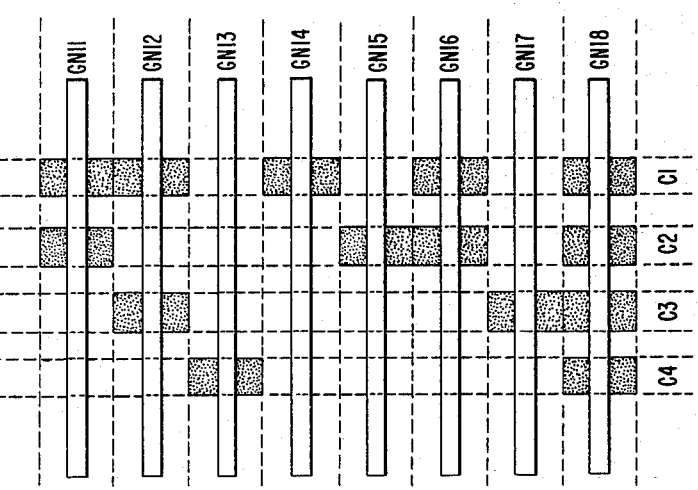

The steps for arranging the device features for the logic portion driver section of the circuit of FIG. 11 in accordance with the present invention are illustrated in FIGS. 12 through 14. FIG. 12 shows the thin oxide regions corresponding to branch transistors T21 through T34 disposed in respective positions in an array. The thin oxide regions are designated by corresponding transistor designations. Since the number of columns in the array corresponding to the single branch is equal to the largest number of transistors in the branch connected to the same gate node and gate node GN18 is connected to four branch transistors (T34, T32, T29, and T25), more than any other gate node, the array has four columns. The array has eight rows each corresponding to one of the gate nodes GN11 and GN18 and designated by the gate node designation.

Formation of the polysilicon paths 1301 and the source/drain regions is depicted in FIG. 13. The complete layout of the logic portion driver section after the opening of contact windows, the formation of metal contacts over the contact windows, and the formation of metal paths for making the remaining interconnections is shown in FIG. 14.

Figure 15:
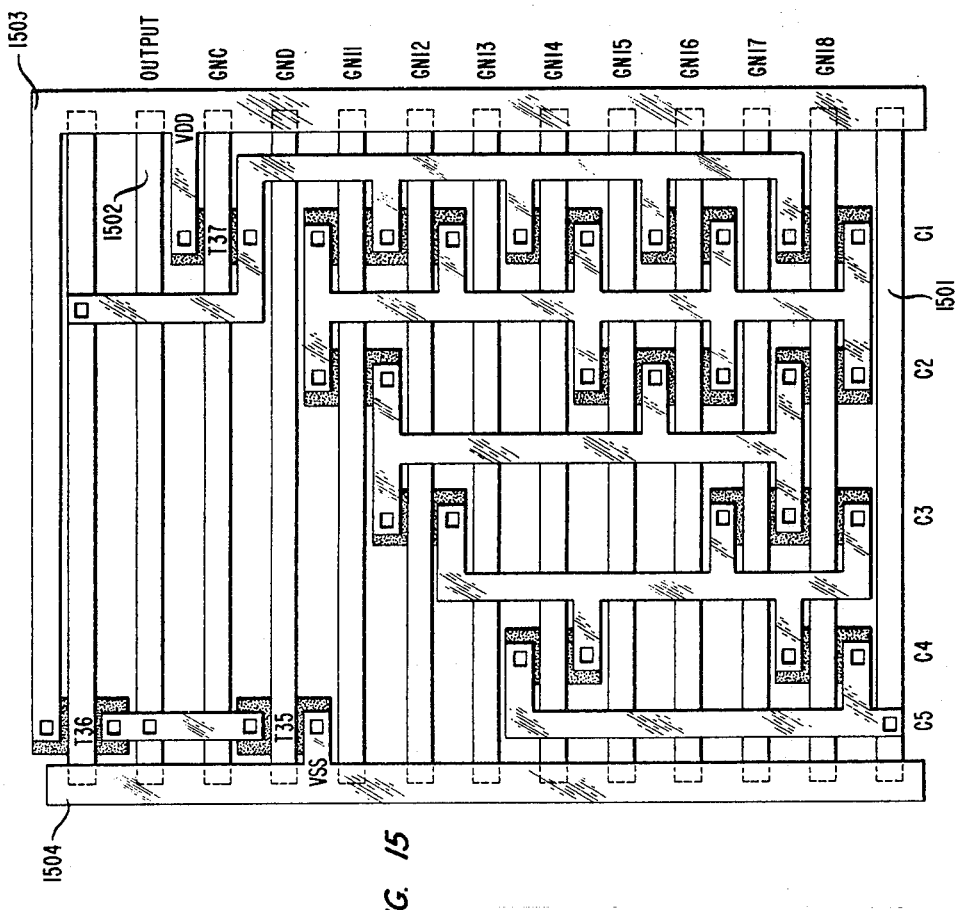

The complete layout of the circuit of FIG. 11 including the load transistor T37 of the driver portion, the load transistor T36 of the output portion and the driver transistor T35 of the output portion is shown in FIG. 15. Polysilicon paths 1501 and 1502 have been added to serve as the switch ground node and the output node, respectively. Wide metal paths and 1503 and 1504 have been added to serve as the VDD node and the VSS node, respectively.

Figure 17:
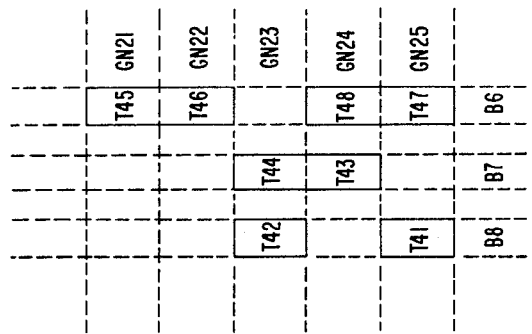
FIG. 17 through 20 are plan views showing in sequence the steps for deriving an arrangement of device features corresponding to the circuit of FIG. 16.
Figure 18:
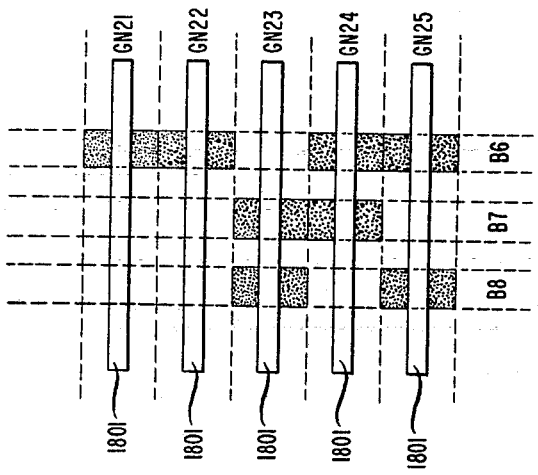
Figure 16:
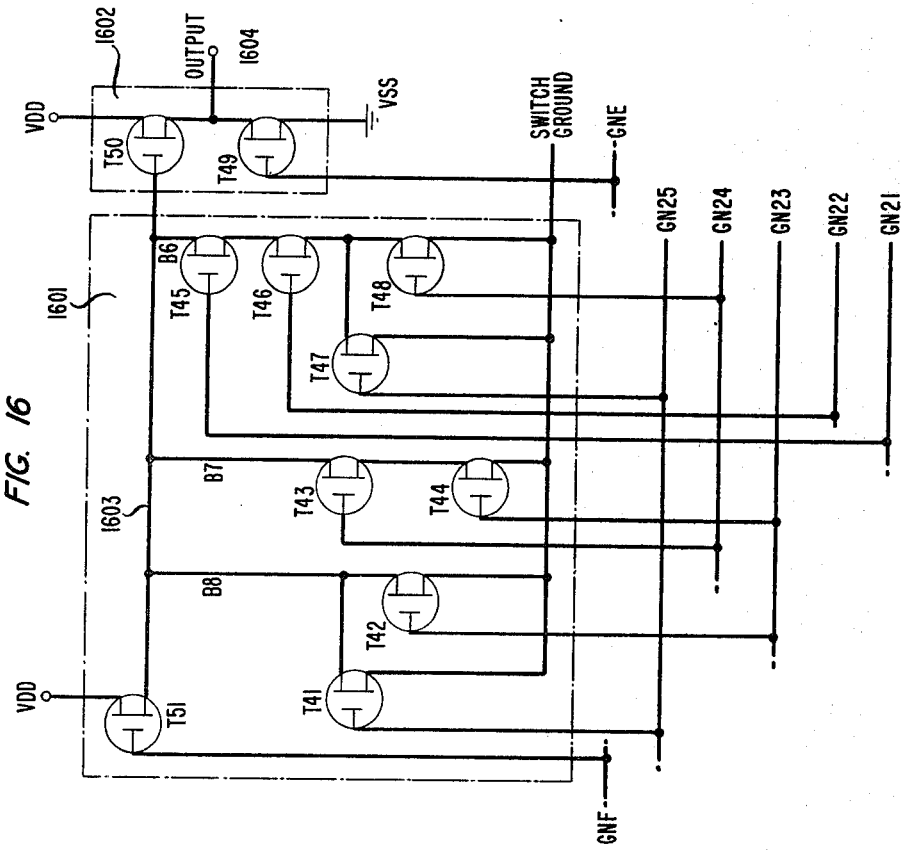
FIG. 16 is a schematic diagram of an IGFET circuit having both parallel and serially connected combinations of branch transistors.
Figure 20:
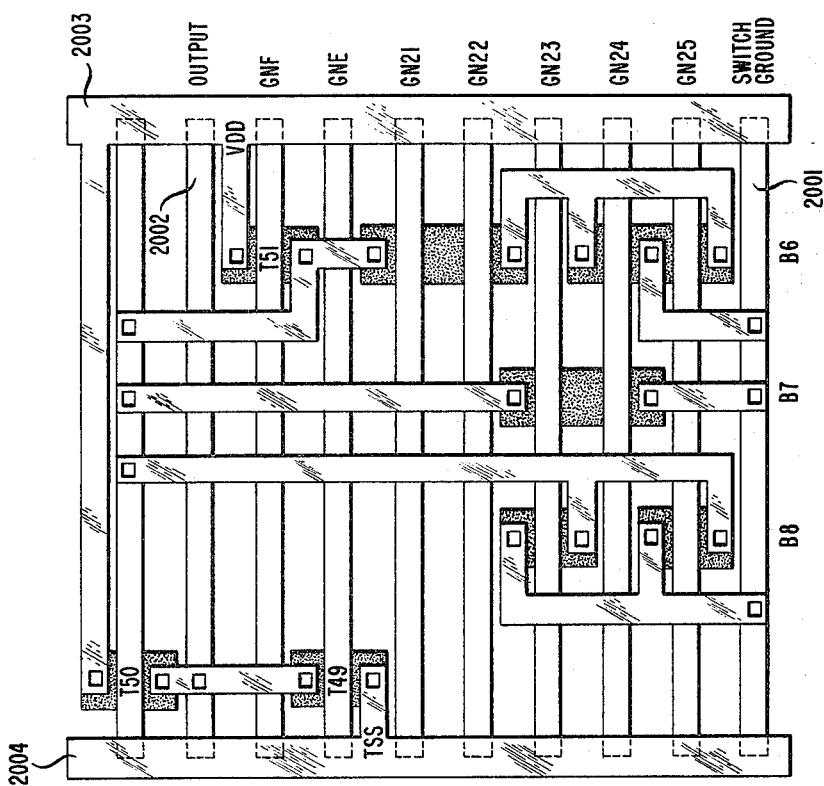
Figure 19:
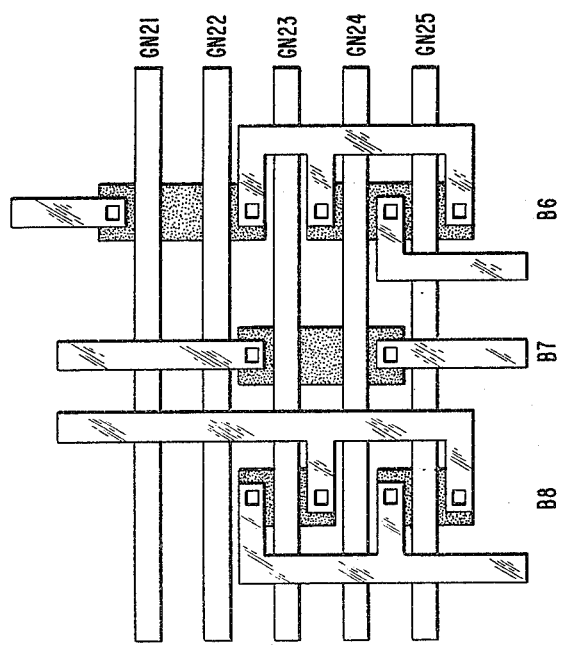

In FIG. 16 there is illustrated a schematic diagram of a circuit which includes both series and parallel combinations of branch transistors. The driver section of the logic portion 1601 has three branches B6, B7 and B8 connected from a signal node 1603 to a switch ground node. Branch B8 consists of a parallel combination of two branch transistors T41 and T42 having their gate electrodes connected to gate nodes GN25 and GN23, respectively. As mentioned above, a parallel combination of individual branch transistors connected between a signal node and a switch ground node is considered as a single branch. Branch B7 consists of a series combination of branch transistors T43 and T44 having their gate electrodes connected to gate nodes GN24 and GN23, respectively. Branch B6 consists of a series combination of branch transistors T45 and T46 connected in series with a parallel combination of branch transistors T47 and T48. The gate electrodes of the branch transistors T45, T46, T47 and T48 are connected to gate electrodes GN21, GN22, GN25, and GN24, respectively. The sequence of steps for layout of the logic portion driver section of the circuit of FIG. 16, in accordance with the present invention, is shown in FIGS. 16 through 19. The placement of the thin oxide regions corresponding to branch transistors T41 through T48 in an array is illustrated in FIG. 17. Since the gate electrodes of branch transistors belonging to any given branch are connected to different gate nodes, the array has three columns, one corresponding to each of the branches B6 through B8. The array has five rows, one corresponding to each of five gate nodes GN21 through GN25. The formation of polysilicon paths 1801 and the source/drain region represented by shaded areas are illustrated in FIG. 18. FIG. 19 shows the opening of contact windows to selected source/drain regions and the formation of metal contacts over the contact windows and the formation metal paths to make the remaining circuit interconnections. The complete layout of the circuit of FIG. 16 including the logic portion load transistor T51, the output portion driver transistor T49 and output portion load transistor T50 is shown in FIG. 20. Polysilicon paths 2001 and 2002 have been added to serve as the switch ground node and the output node, respectively. Wide metal paths 2003 and 2004 have been added to serve as the VDD and VSS nodes, respectively.

In the preferred embodiment of the present invention all of the input and output signal lines of a circuit are restricted to be formed as regularly spaced polysilicon paths (see, FIGS. 10, 15, and 20) including those in the spare rows. This restriction facilitates the interconnection of one circuit portion with another on the same chip and alleviates the previously mentioned difficulties which arise when the task of chip layout for a large LSI circuit is divided into separate portions for layout among two or more chip designers. The present invention would restrict each chip designer to a common layout "method" which permits signal line positions and chip area boundaries to be predetermined. Thus, the portions of the chip by the different designers may be combined without difficulty and the efficiency of chip area usage of the combined layout approaches that of a "handpacked" layout performed by a single chip designer.

As can be seen from FIGS. 10, 15, and 20, the layouts performed in accordance with the present invention are characterized by arrangements of device features having a high degree of order and regularity. These characteristics which are not normally found in a "handpacked" layout facilitate checking for layout errors. For example, in FIGS. 10, 15, and 20, the spacing between parallel edges of adjacent polysilicon paths and the spacing between parallel edges of adjacent thin oxide regions are easily checked by visual inspection. The relationship between the positions of transistors in an array and their positions in a schematic diagram facilitates the verification of the layout with the schematic diagram. Furthermore, because the layout process occurs through a systematic sequence of well defined steps, the liklihood of making layout errors is reduced.

Although in the above-described embodiments the thin oxide regions are depicted as being rectangular in shape and of uniform size, other shape and nonuniform sizes may also be used provided that the design rules of the particular technology being used to fabricate the circuit and the rules of the present invention are observed. Moreover, although in the above-described embodiments, interconnection and contacts to the source/drain regions of the transistors are provided by contact windows, metal contacts and metal paths, equivalent conductor paths and contact means such as those provided by diffused or ion-implanted low resistivity paths formed in the silicon bulk regions which join the source/drain regions may be substituted.

In addition to the described embodiments, applications and modifications, other embodiments, applications and modifications which will be obvious to those skilled in the art are included within the spirit and scope of the invention.

We claim:

1. A method for fabricating a random-logic IGFET integrated circuit having a multiplicity of transistors in a prescribed arrangement, the method comprising the steps of:
   (1) forming on a single substrate chip a multiplicity of gate insulator regions, each associated with a different one of the transistors and overlying a semiconductive bulk region, the gate insulator regions being disposed in respective positions in an array of intersecting rows and columns, the gate insulator regions being spaced apart, except that the gate insulator regions situated in adjacent rows within a column being adjoined to form merged gate insulator regions;
   (2) forming on the chip a plurality of spaced apart gate conductor paths, each positioned to lie along a respective one of the rows and to overlie the gate insulator regions in the respective one of the rows and serving as the gate electrode where crossing a gate insulator region;
   (3) forming source/drain regions in portions of the semiconductive bulk region underlying portions of the gate insulator regions not covered by a gate conductor path;
   (4) forming contact means to the source/drain regions; and
   (5) forming above the semiconductive bulk region a plurality of second conductor paths for interconnecting the contact means and extending generally orthogonally to the gate conductor paths.

2. A method for fabricating a random-logic IGFET integrated circuit, the circuit having a signal node, a common node, one or more branches connected from the signal node to the common node, a multiplicity of branch transistors connected in series and/or parallel combinations along the branches, each branch transistor having a gate electrode connected to one of a plurality of gate nodes, the method comprising the steps of:
   (1) forming on a single substrate chip a multiplicity of gate insulator regions, each associated with a different one of the branch transistors and overlying a semiconductive bulk region, the gate insulator regions being disposed in respective positions in an array of intersecting columns and rows, at least one column corresponding to each branch and containing gate insulator regions associated with branch transistors of the corresponding branch, each row corresponding to a respective one of the gate nodes and containing gate insulator regions associated with branch transistors having gate electrodes connected to the corresponding gate node, the gate insulator regions being spaced apart, except that the gate insulator regions situated in adjacent rows within a column being adjoined to form merged gate insulator regions;
   (2) forming on the chip a plurality of spaced apart gate conductor paths, each positioned to lie along a respective one of the rows and to overlie all gate insulator regions in the respective one of the rows;
   (3) forming source/drain regions in portions of the semiconductive regions underlying portions of the gate insulator regions not covered by a gate conductor path;
   (4) forming contact means to selected ones of the source/drain regions; and
   (5) forming above the semiconductive bulk region a plurality of second conductor paths for interconnecting the contact means.

3. A method for fabricating a random-logic IGFET integrated circuit as recited in claim 2 wherein the number of columns in the array corresponding to a branch is equal to the largest number of branch transistors in the branch having gate electrodes connected to a common gate node.

4. A method for fabricating a random-logic IGFET integrated circuit as recited in claim 3 wherein the gate conductor paths are formed to be parallel and regularly spaced.

* * * * *